United States Patent
Lightbody et al.

(10) Patent No.: US 7,265,533 B2
(45) Date of Patent: Sep. 4, 2007

(54) NON-INTRUSIVE POWER MONITOR

(75) Inventors: Simon H. Lightbody, Victoria (CA);
Michael E. Teachman, Victoria (CA);
Colin N. Gunn, Victoria (CA);
Benedikt T. Huber, Victoria (CA)

(73) Assignee: Power Measurement Ltd., Saanichton (CA)

(*) Notice: Subject to any disclaimer, the term of this patent is extended or adjusted under 35 U.S.C. 154(b) by 269 days.

(21) Appl. No.: 10/868,374

(22) Filed: Jun. 15, 2004

(65) Prior Publication Data

US 2005/0275397 A1    Dec. 15, 2005

(51) Int. Cl.
*G01R 31/28* (2006.01)
*G01R 31/26* (2006.01)

(52) U.S. Cl. .................................................. 324/158.1

(58) Field of Classification Search ..................... None
See application file for complete search history.

(56) References Cited

U.S. PATENT DOCUMENTS

| | | | |
|---|---|---|---|
| 3,477,024 A | 11/1969 | Pelta | |
| 4,009,477 A | 2/1977 | Rozylowicz | |
| 4,233,546 A | 11/1980 | Berthiaume | |
| 4,384,289 A | 5/1983 | Stillwell et al. | |
| 4,611,207 A | 9/1986 | Anderson et al. | |
| 4,709,399 A | 11/1987 | Sanders | |
| 4,724,381 A | 2/1988 | Crimmins | |
| 4,758,962 A | 7/1988 | Fernandez | |
| 4,791,361 A | 12/1988 | Beihoff et al. | |
| 4,795,973 A | 1/1989 | Smith-Vaniz et al. | |
| 4,799,005 A | 1/1989 | Fernandes | |
| 4,886,980 A | 12/1989 | Fernandes et al. | |
| 4,894,785 A | 1/1990 | Fernandes | |
| 5,051,733 A | 9/1991 | Neuhouser | |
| 5,181,026 A | 1/1993 | Granville | |
| 5,235,861 A | 8/1993 | Seppa | |
| 5,448,138 A | 9/1995 | Staggs | |
| 5,473,244 A | 12/1995 | Libove et al. | |

(Continued)

FOREIGN PATENT DOCUMENTS

GB    2338790    12/1999

(Continued)

OTHER PUBLICATIONS

Andrew Klimek, B.Sc., M.Sc., "Optical Technology: A New Generation of Instrument Transformer." Electricity Today, Ontario Canada, Mar. 2003, pp. 38-39.

(Continued)

*Primary Examiner*—Ha Tran Nguyen
*Assistant Examiner*—Trung Q. Nguyen
(74) *Attorney, Agent, or Firm*—Workman Nydegger

(57) ABSTRACT

Systems and methods for monitoring power in a conductor. A flex circuit may include multiple layers including a voltage sensing layer, a coil layer, and a ground layer. The coil layer includes traces that form a coil structure around a conductor when the flex circuit is wrapped around the conductor. The coil layer generates a voltage that may be integrated to determine a current in the conductor. When the flex circuit is wrapped around the conductor, the voltage sensing layer is closest to the conductor. The voltage sensing layer forms a capacitor with the conductor. Using an adjustable capacitive voltage divider, the voltage of the conductor may be determined from a voltage signal received from the voltage sensing layer.

27 Claims, 7 Drawing Sheets

U.S. PATENT DOCUMENTS

| | | | |
|---|---|---|---|
| 5,517,864 | A | 5/1996 | Seppa |
| 5,559,377 | A | 9/1996 | Abraham |
| 5,559,430 | A | 9/1996 | Seppa |
| 5,808,424 | A | 9/1998 | Osgood |
| 5,825,175 | A | 10/1998 | Selcuk |
| 5,892,430 | A | 4/1999 | Wiesman et al. |
| 5,918,288 | A | 6/1999 | Seppa |
| 6,313,623 | B1 * | 11/2001 | Kojovic et al. ............. 324/127 |
| 6,366,076 | B1 * | 4/2002 | Karrer et al. ........... 324/117 R |
| 6,470,283 | B1 | 10/2002 | Edel |
| 6,646,859 | B2 | 11/2003 | Vahamaki et al. |
| 6,671,635 | B1 | 12/2003 | Forth et al. |
| 2001/0015149 | A1 | 8/2001 | Montambault et al. |
| 2003/0200038 | A1 | 10/2003 | Schweitzer, III et al. |

FOREIGN PATENT DOCUMENTS

| | | |
|---|---|---|
| WO | WO 00/52483 | 9/2000 |
| WO | WO 02/082105 A1 | 10/2002 |
| WO | WO 2004/068151 A1 | 8/2004 |

OTHER PUBLICATIONS

K.E. Holbert and G.T. Heydt, "Prospects for Dynamic Transmission Circuit Ratings," IEEE International Symposium on Circuits and Systems (ISCAS), Sydney, Australia, May 2001, vol. 3, pp. 205-208.

E.F. Donaldson et al., "Autonomous Current Sensing for High Voltage Systems with Auxiliary Optical Energisation," Sensor Review, England. Apr. 2001, Feb. 2001, pp. 126-132.

N.D. Sadanandan et al., "Power Donut System Laboratory Test and Data Analysis,"IEEE: Proceedings—1990 Southeastcon, New Orleans, LA, Mar. 1990, pp. 675-679.

Engelhardt et al., "Design, Installation and Field Experience with an Overhead Transmission Dynamic Line Rating System," IEEE 1995, pp. 366-370.

U.S. Department of Transportation; Federal Aviation Administration, "Advisory Circular AC70/7460-1K: Obstruction Marking and Lighting," Aug. 2000, pp. 1-34 Appendices 1 and 2.

U.S. Department of Transportation; Federal Aviation Administration, "Advisory Circular AC150/5345-43E: Specification for Obstruction Lighting Equipment," Oct. 1995, pp. 1-16.

Ion Reference Manual, Power Management, Mar. 2004, pp. 1-5.

Analog Devices, *Single-Phase Multifunction Metering IC with di/dt Sensor Interface*, ADE 7753, 2003.

Departamento de Engenharia de Linhas de Transmissão—ER/LT, GLT/16, Grupo III, Grupo De Estudos De Linhas De Transmissão (GLT), Aumento Da Capacidade De Transmissão DE Linhas Aé, utilizando Cabo CAA De Liga De Aluminio Termorresisténte, 1999.

* cited by examiner

NON-INTRUSIVE POWER MONITOR

CROSS-REFERENCE TO RELATED APPLICATIONS

Not applicable.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. The Field of the Invention

The present invention relates to the field of power measurement. More particularly, the present invention relates to systems and methods for monitoring electrical power.

2. The Relevant Technology

Electricity has become an indispensable part of people's lives and electricity is used in many aspects of life. Homes, business, factories, and communities all use varying amounts of electricity. In practical terms, all of the devices, machines, motors, air conditioning equipment, fans, manufacturing equipment, other electrically powered industrial equipment, etc., that need electricity to operate can be viewed as some type of load.

While the electricity delivered to a particular entity is usually measured by the power company for various purposes including billing purposes, monitoring the electrical power consumption of an individual load is not usually performed by the power company. In fact, monitoring the power consumption of an individual load is often not cost effective to the owner of the load. This may be due to the fact that the capital and installation cost of a monitoring device such as a power meter is too high relative to the amount of power being consumed by the load.

Although the cost of the power being consumed by the load may not justify the installation of a power meter, the costs associated with the failure of the load may be many times greater. This means that after experiencing a failure, many industrial customers "wish" they would have had monitoring equipment installed even though the costs were not initially justifiable. Possible electrical failures include those due to voltage sag, motor insulation breakdown, etc.

Many impending failures can be detected if appropriate monitoring equipment is present. If the power is being monitored, then appropriate actions can be taken when certain situations occur. This may prevent the failure of a load or may reduce the down time of the load. As previously indicated, however, power monitoring equipment is often not installed because of the associated cost. Much of the cost of installing a monitoring device such as a power meter may be due to the costs of wiring voltage, current and communications connections.

In addition to the costs associated with a power meter, power meters are also not used because they are difficult to install and use. For example, conductors must often be temporarily disconnected from the load and/or de-energized in the process of installing the monitoring device. In other words, the installation of the monitoring device results in down time for the load. The removal of the monitoring device may also require the conductors to be temporarily disconnected from the load and/or de-energized. In addition, the time required to both install/remove the power meter from a particular load makes it difficult to use for different loads. In other words, each load experiences down time when this type of power meter is being used.

BRIEF SUMMARY OF THE INVENTION

These and other limitations are overcome by embodiments of the present invention, which relate to systems and methods for monitoring electrical power including voltage and/or current. In one embodiment, power is monitored using a flex circuit that comprises a voltage sensing layer including a conductive plane and a coil layer with traces formed therein. The voltage sensing layer forms a capacitance with a conductor when the flex circuit is wrapped around the conductor and a voltage signal from the voltage sensing layer is used to determine a voltage of the conductor. The traces in the coil layer form a coil structure when the flex circuit is wrapped around the conductor and a voltage signal from the coil layer is used to determine a current in the conductor.

In another embodiment, a power monitoring system monitors electrical characteristics of a conductor through which electrical power is supplied to a load. The system includes a flex circuit having a plurality of layers and a module that receives signals produced by the flex circuit. The flex circuit is operative to be coupled with a conductor such that the traces form a coil structure around the conductor. The signals produced by the flex circuit are processed by the module to determine at least one of a voltage, a current, and an amount of energy delivered to a load through the conductor.

In another embodiment, a power monitoring system includes a module and a flex circuit coupled to the module. The flex circuit has a voltage sensing layer and a coil layer and is configured to wrap around a conductor. A first input in the module receives a voltage signal from the voltage sensing layer and determines a voltage of the conductor from the voltage signal. A second input in the module receives another voltage signal from the coil layer and this voltage signal is integrated to determine a current of the conductor.

In another embodiment of the invention, a flex circuit that can removably wrap around a conductor to monitor at least one of a voltage and a current of the conductor includes a voltage sensing layer, a ground layer, and a plurality of traces. The voltage sensing layer is adjacent an insulation of the conductor when the flex circuit is wrapped around the conductor. The ground layer is arranged over the voltage sensing layer. The plurality of traces are arranged in one or more layers between the voltage sensing layer and the ground layer. The traces further form a single conductive path that forms a coil structure when the flex circuit is wrapped around the conductor.

In one embodiment, a power monitoring system that monitors at least one power parameter in a conductor that provides electrical power to a load includes a metallic layer, a capacitor bank, and a processor. The metallic layer is operative to be wrapped around a conductor while remaining electrically insulated from the conductor. The capacitor bank is coupled between the metallic layer and a ground point. The capacitor bank is operative to apply different capacitances between the metallic layer and the ground point. The processor can adjust the capacitance of the capacitor bank. The processor measures voltages across the capacitor bank for at least two different capacitances and calculates the voltage on the conductor therefrom.

In another embodiment, a method for monitoring electrical power in a conductor includes forming a voltage sensing layer of a flex circuit, forming a coil layer in the flex circuit, and insulating the coil layer from the voltage sensing layer. The voltage sensing layer includes a conductive plane. The coil layer includes a plurality of traces that form a single conductive path in the flex circuit and also form a coil structure when the flex circuit is wrapped around the conductor.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

To clarify the use in the pending claims and to hereby provide notice to the public, the phrases "at least one of <A>, <B>, . . . and <N>" or "at least one of <A>, <B>, . . . <N>, or combinations thereof" are defined by the Applicant in the broadest sense, superceding any other implied definitions herebefore or hereinafter unless expressly asserted by the Applicant to the contrary, to mean one or more elements selected from the group comprising A, B, . . . and N, that is to say, any combination of one or more of the elements A, B, . . . or N including any one element alone or in combination with one or more of the other elements which may also include, in combination, additional elements not listed.

In electrical systems, electrical power is typically delivered to a load through a conductor. The performance of the load is often affected by the characteristics (voltage, current, energy, for example) of the electrical power or power supply. It is therefore useful to monitor these characteristics in order to maximize the performance of the load. Unfortunately, the drawbacks of conventional power meters often outweigh the benefits of power meters even though by monitoring the power supply, power failures can be predicted or even averted.

Embodiments of the present invention can measure electrical characteristics of the electrical power being supplied to a load by measuring the voltage and/or current in a conductor that is coupled to a load. Advantageously, the electrical characteristics can be measured without having to disconnect the conductor or de-energize the load. Embodiments of the invention are portable and can be used to monitor the electrical power being delivered to multiple loads. This is achieved in one example with a flex circuit that is adapted to removably wrap around a conductor. Alternatively, the flex circuit may be permanently mountable to a conductor using appropriate adhesive, mounting arrangements, and the like.

The flex circuit has multiple layers that provide signals to a power module that processes and interprets the signals from the flex circuit to determine electrical characteristics such as voltage, current, and energy. At least one of the layers of the flex circuit generates a signal that is used to determine the voltage of a conductor while at least one other layer is used to generate a signal used to determine the current in the conductor. Alternatively, the flex circuit may be provided with layers for determining voltage only or current only. In one embodiment, when the flex circuit is permanently mounted to coupled to the conductor, the flex circuit may include a connector that permits the power module to be connected/disconnected from the flex circuit.

Figure 1A:
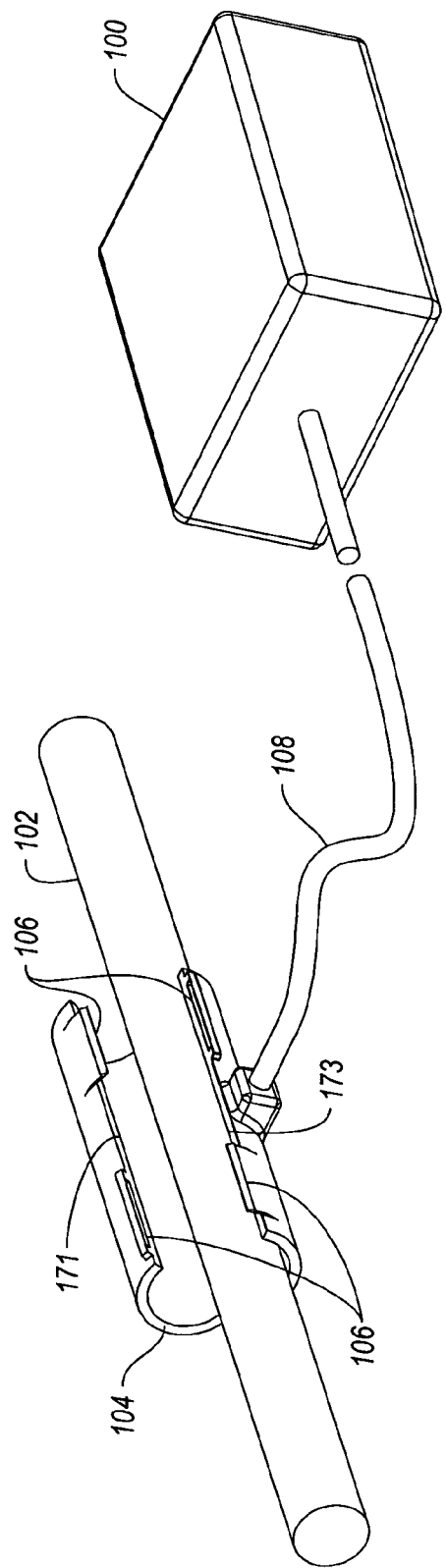
FIG. 1A illustrates an example of a flex circuit in an open position before being wrapped around a conductor.
Figure 1B:
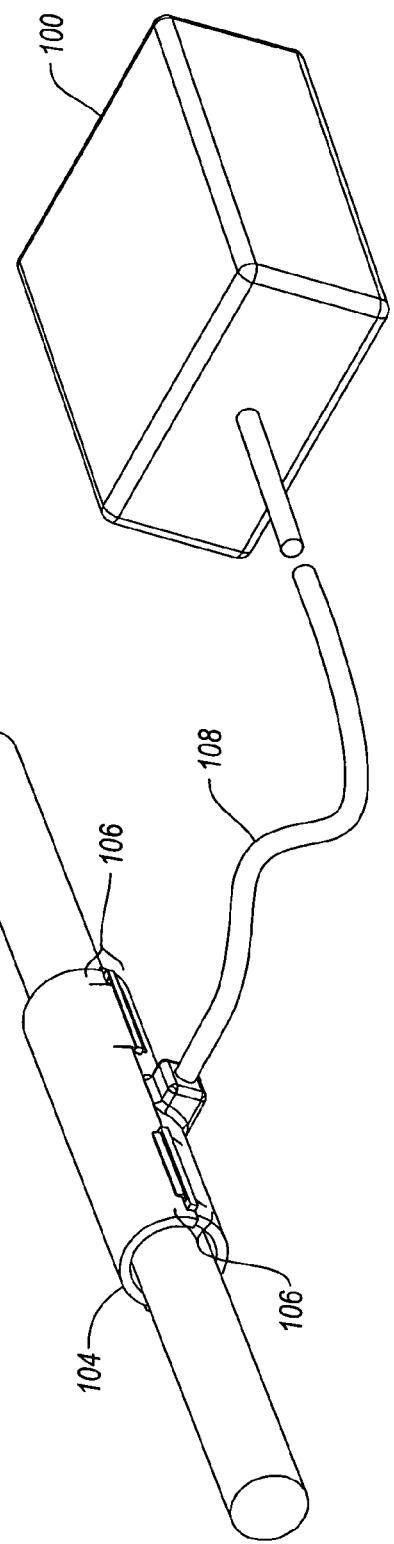
FIG. 1B illustrates an example of a flex circuit in a closed position and wrapped around a conductor.

FIGS. 1A and 1B illustrate exemplary embodiments of the invention and further illustrate the ease with which a flex circuit can be coupled to a conductor to monitor the electrical characteristics or parameters of the conductor including the voltage and/or current. FIG. 1A illustrates a conductor 102 that connects a power supply to a load. The conductor 102 is the electrical connection through which electrical power is supplied to a load. Embodiments of the invention monitor the electrical power or more specifically, monitor the voltage and/or current that is delivered to a load through the conductor 102.

The power monitor includes a flex circuit 104 that is coupled to a module 100 via a cord 108. The module 100 includes components and circuitry that interface with the flex circuit and that perform computations on the signals received from the flex circuit to determine various electrical characteristics including, for example, current, voltage, energy and/or power.

In FIG. 1A, the flex circuit 104 is shown in an open position. FIG. 1B illustrates the flex circuit 104 in a closed position about the conductor 102. In a closed position, the flex circuit is wrapped around the conductor 102. The flex circuit 104 includes connectors 106 that enable the flex circuit to be securely and removably fastened around the conductor 102. Alternatively, the flex circuit 104 may be coupled to the conductor 102 using any other appropriate fastening means such as an adhesive, tape, etc. Preferably, the flex circuit 104 is fastened to the conductor 102 such that the flex circuit 102 is adjacent or touching the insulation of the conductor 102. Alternatively, if the conductor 102 is un-insulated, an appropriate insulating layer may be provided between the flex circuit 104 and the conductor 102. One of skill in the art can appreciate that the flex circuit 104 can also be loosely positioned about the conductor 102.

Figure 2A:
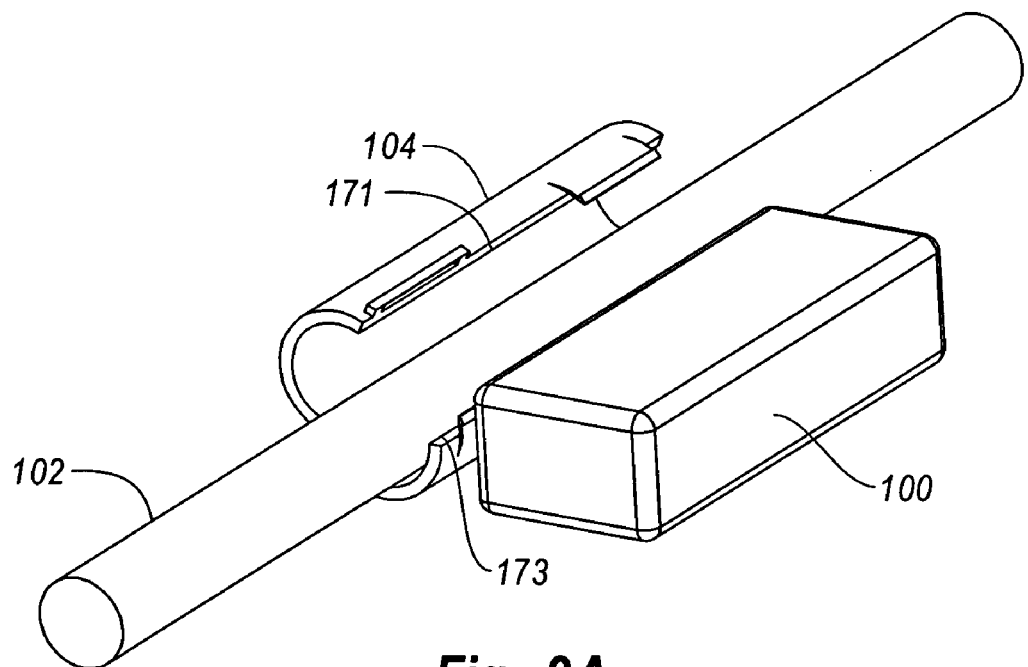
FIG. 2A illustrates another embodiment of a flex circuit in an open position and coupled to a module that interprets signals from the flex circuit.
Figure 2B:
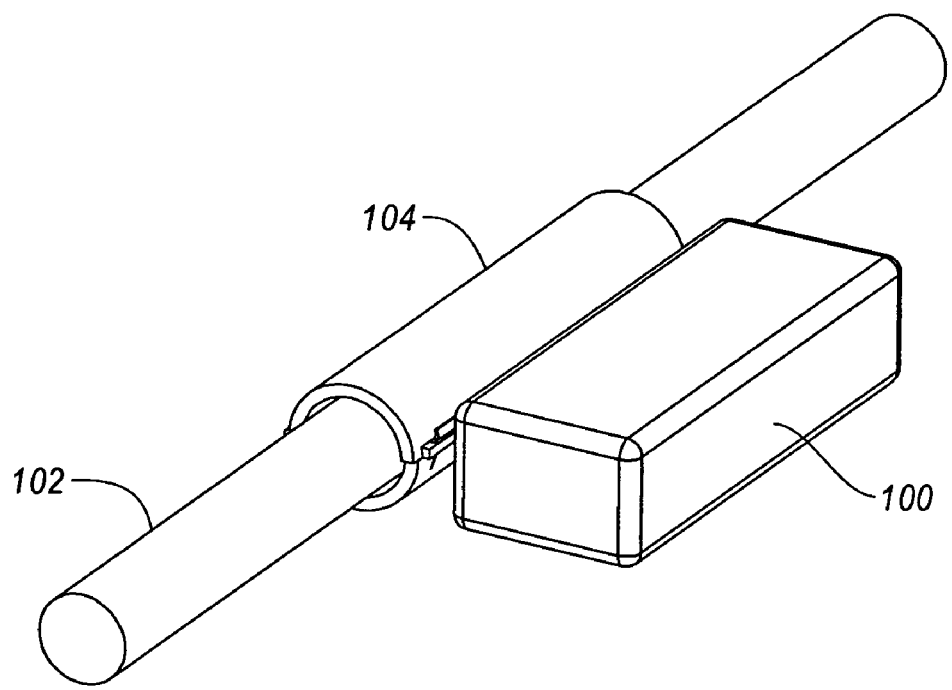
FIG. 2B illustrates the flex circuit of FIG. 2A in a closed position.

The cord 108 connects the flex circuit 104 with the module 100 both electrically and mechanically. FIGS. 2A and 2B illustrate an embodiment where the cord connecting the flex circuit 104 with the module 100 is not present or is shorter. Alternatively, the module 100 circuitry may be mounted on an extension of the flex circuit 104. In this example, the flex circuit 104 interfaces directly with the module 100. In fact, the module 100 may be configured to disconnect from the flex circuit 104. This permits the flex circuit 104 to be left attached to the conductor 102. As previously stated, the flex circuit 104 may be permanently coupled to the conductor 102 in some embodiments.

Figure 3A:
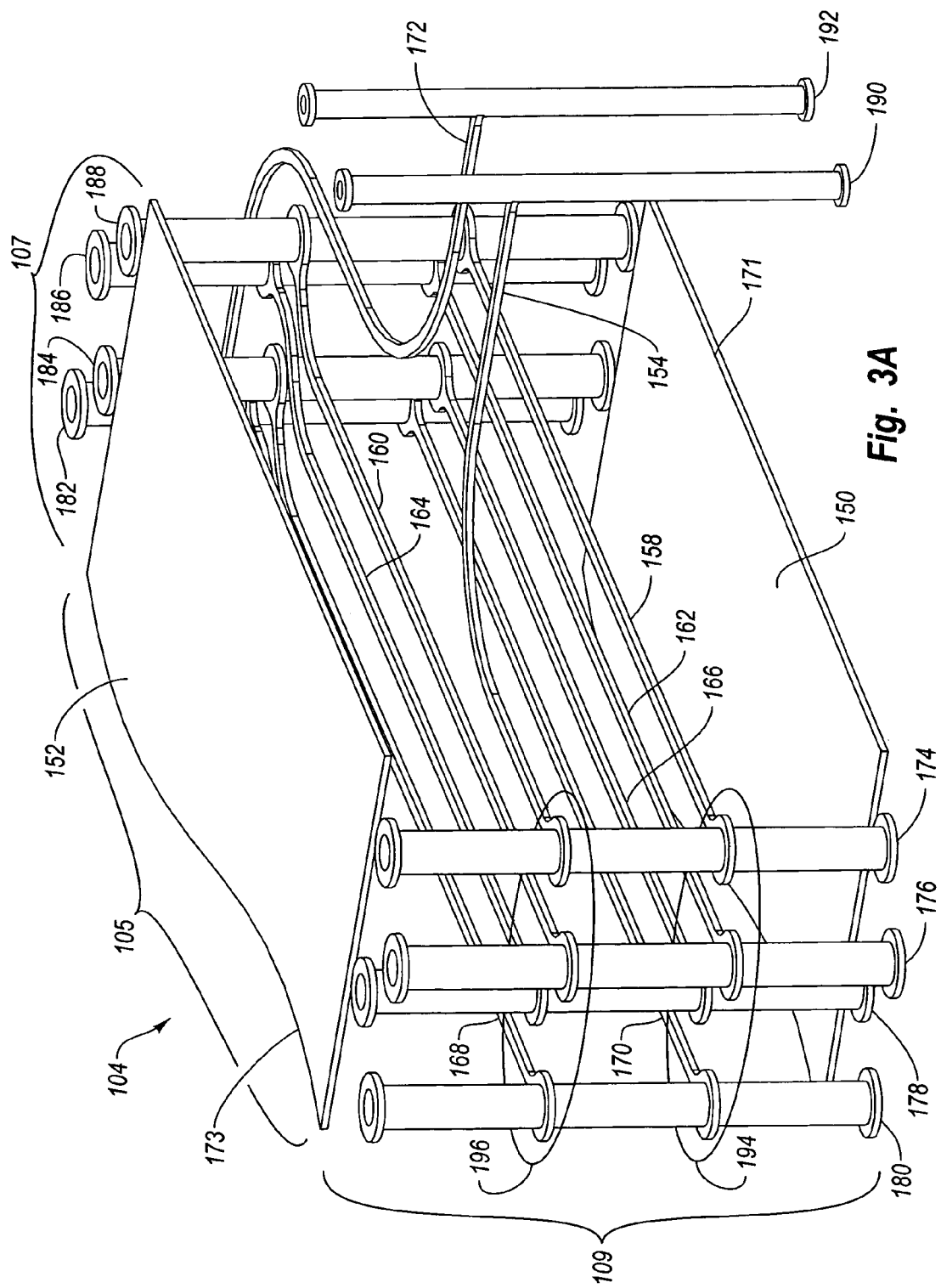
FIG. 3A illustrates an expanded perspective view of one embodiment of the layers in a flex circuit and illustrates the conductive traces that form or approximate the structure of a coil when the flex circuit is wrapped around a conductor.

FIG. 3A illustrates an expanded perspective view of a flex circuit 104. This example of a flex circuit 104 includes four layers that are typically insulated from each other. The layer 150 and the layer 152 are conductive planes and correspond, depending on the orientation of the flex circuit 104, to the voltage sensing layer and the ground layer. The layer 150 and the layer 152 may be metallic or conductive layers.

The coil layer, which includes the layer 194 and the layer 196 in this example, includes multiple traces that are configured to form a single conductive path. When the flex circuit 104 is wrapped around a conductor, the traces in the layers 194 and 196 form a structure that approximates a coil. In one embodiment, the traces in the layers 194 and 196 approximate the structure of a Rogowski coil. For ease of illustration, a limited number of coil traces have been shown in FIG. 3. A more typical example may include approximately 50 or more traces and vias. Typical dimensions are variable, but one example may include a length 105 of 60 mm, a width 107 of 35 mm and a height 109 of 0.25 mm.

In this embodiment, the flex circuit 104 has vias 174, 176, 178, and 180 disposed at a first end of the flex circuit 104. Vias 182, 184, 186, and 188 are disposed at an opposing end of the flex circuit 104 from the first end. The vias are connected using conductive traces in the flex circuit in two different layers. As previously stated, the conductive traces are arranged such that a coil or a structure approximating a coil is formed by the conductive traces in the layers 194 and 196 when the flex circuit 104 is wrapped around a conductor.

In this example, the vias 190, 192 are coupled to or are configured to interface with the module 100 either directly or through an appropriate connector. The layers 150 and 152 may also interface with the module 100. The vias 190 and 192 correspond to the ends of the coil or coil-like structure that is formed by the traces in the flex circuit 104. In FIG. 3A, a conductive trace 154 from the via 190 leads to the via 174 in the layer 196. The via 174 conductively connects the trace 154 with the trace 158 in the layer 194. The trace 158 leads to the via 188 on the other end of the flex circuit 104 and the via 188 conductively connects the trace 158 to the conductive trace 160. The conductive trace 160 leads to the via 176, which conductively connects the trace 160 with the conductive trace 162. FIG. 3A illustrates that this pattern continues until the conductive trace 172 leads back to the via 192, thereby completing a conductive single conductive path through layers 194, 196 that began at the via 190.

More generally, the conductive traces in the flex circuit 104 are formed in two layers 194, 196 that are located between the layers 150, 152. One of skill in the art can appreciate that the conductive traces can be formed in a single layer. One of skill in the art can also appreciate that the conductive traces can be formed in more than two layers and in various relative positions to layers 150, 152. If the conductive traces are followed in a path from the via 190 to the via 192, then conductive traces from the vias 174, 176, 178, and 180 to the vias 182, 184, 186, and 188 are in the layer 194. Conductive traces from the vias 182, 184, 186, and 188 to the vias 174, 176, 178, and 180 are in the layer 196. As previously stated, the traces in the layers 194, 196 are insulated in order to form the coil or the approximate coil structure when the flex circuit is wrapped around a conductor.

The width 107 of the flex circuit 104 is typically selected such that the coil formed by the traces does not overlap itself. In other words, the ends 171, 173 of the flex circuit 104 should be adjacent when the flex circuit 104 is wrapped around a conductor. Thus, the circumference of the conductor may be used to select a flex circuit of an appropriate width 107. However, the electrical characteristics of the conductor can still be measured even if the width 107 of the flex circuit is too short or too long.

The example of the flex circuit 104 illustrated in FIG. 3A can be used to sense the voltage of a conductor and/or the current in the conductor. When used as a voltage sensor, one of the plane layers is used as a voltage sensing layer and the other plane layer is a ground layer. When the flex circuit 104 is attached to a conductor, the voltage sensing layer is usually placed closest to the conductor. In other words, the inner plane layer is the voltage sensing plane.

Figure 3B:
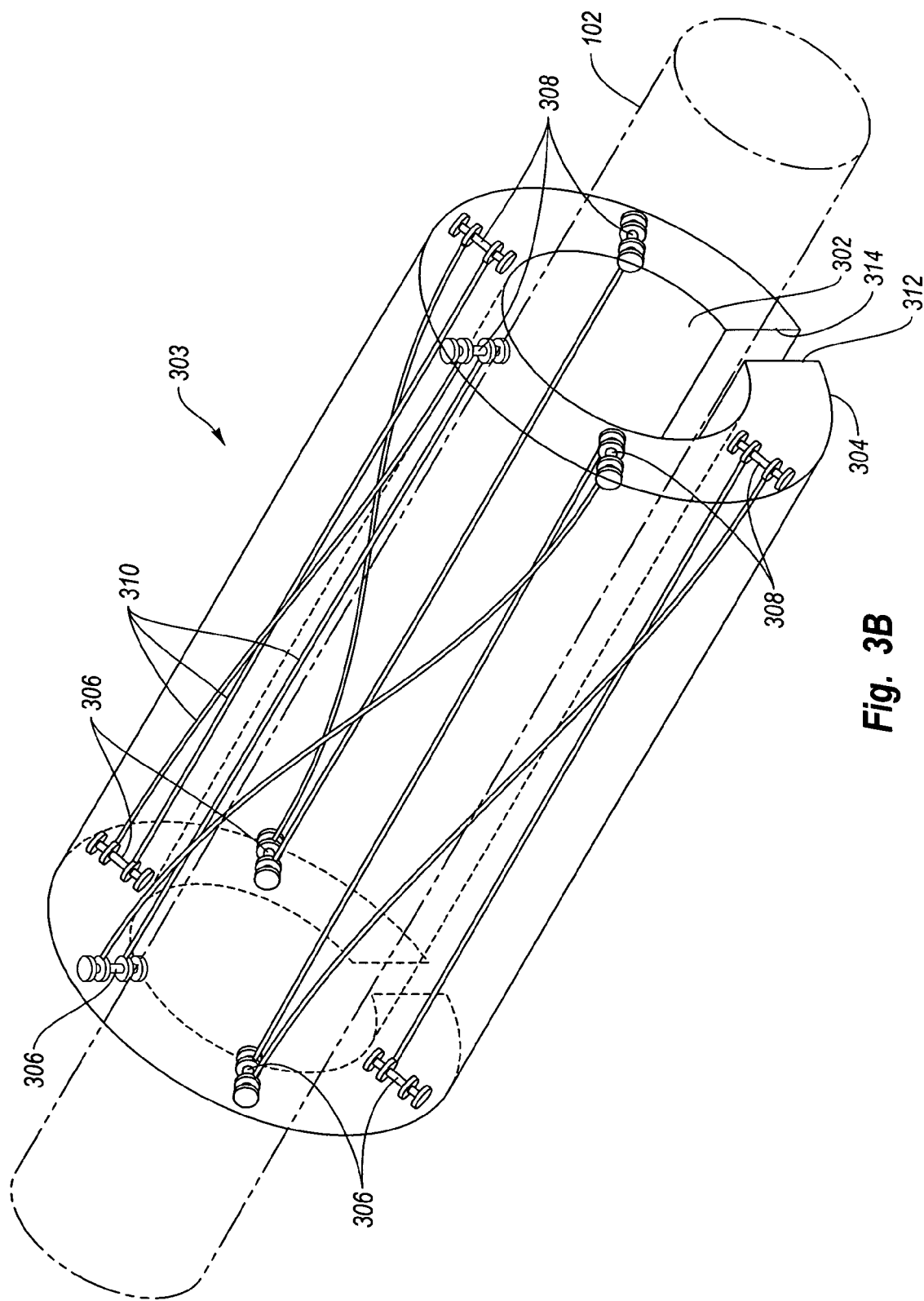
FIG. 3B illustrates a perspective view of one embodiment of a flex circuit that is operatively wrapped around a conductor and illustrates one example of a coil or a coil-like structure formed by traces in the flex circuit.

FIG. 3B further illustrates a perspective view of one embodiment of a flex circuit that is operatively coupled to a conductor. The flex circuit 303 is similar to the flex circuit 104. As shown in FIG. 3B, the flex circuit 303 is wrapped around the conductor 102. A voltage sensing layer 302 of the flex circuit 303 is closest to the conductor 102. A ground plane or ground layer 304 is arranged over the voltage sensing layer 302. The vias 308 formed in the flex circuit 303 are on a first end and the vias 306 are on an opposing end of the flex circuit 303 from the vias 308. The traces 310 are connected to the vias 306, 308 as described previously. The traces 310 form a coil or a coil-like structure when the flex circuit is wrapped around the conductor 102. The traces 310 are substantially parallel with the conductor 102. In this example, the end 312 is adjacent the end 314 when the flex circuit 303 is coupled to the conductor 102.

In one embodiment, the flex circuit 104 uses a capacitive voltage divider to sense the voltage associated with the conductor 102. When the flex circuit 104 is wrapped around a conductor (FIG. 3B illustrates one embodiment of a flex circuit wrapped around a conductor), the conductor 102 forms the first plate of a first capacitor. The voltage sensing layer 152 or the inner layer of the flex circuit 104 is the second plate of the first capacitor.

A second capacitor 411 (shown in FIG. 4) is a physical capacitor located on the module 100 and has a capacitance that is typically known. A third capacitor may be formed by the ground plane 152 of the flex circuit 104 and of the module to a ground (such as switchgear or other chassis ground). Alternatively, the ground plane 152 may be grounded to the system ground and therefore the third capacitor is not present. The voltage across the second capacitor is proportional to and in phase with the voltage between the conductor being monitored and ground. This voltage signal from the voltage sensing layer may be amplified on the module 100 and analyzed to identify the voltage of the conductor.

The flex circuit of FIGS. 1A-3B can also be used to sense current in a conductor. With reference to FIG. 3A, the coil layer of the flex circuit 102, which includes the inner layers 194, 196, as previously discussed, form a coil, coil windings or a coil-like structure when the flex circuit is wrapped around a conductor. The traces in the flex circuit, in other words, form a wound core with a thin but long window area. The length of the coil may be dependent on the dimensions of the flex circuit and the number of turns may also be dependent on the dimensions of the flex circuit. The voltage across the coil may also be amplified and analyzed by the module as described below.

Figure 4:
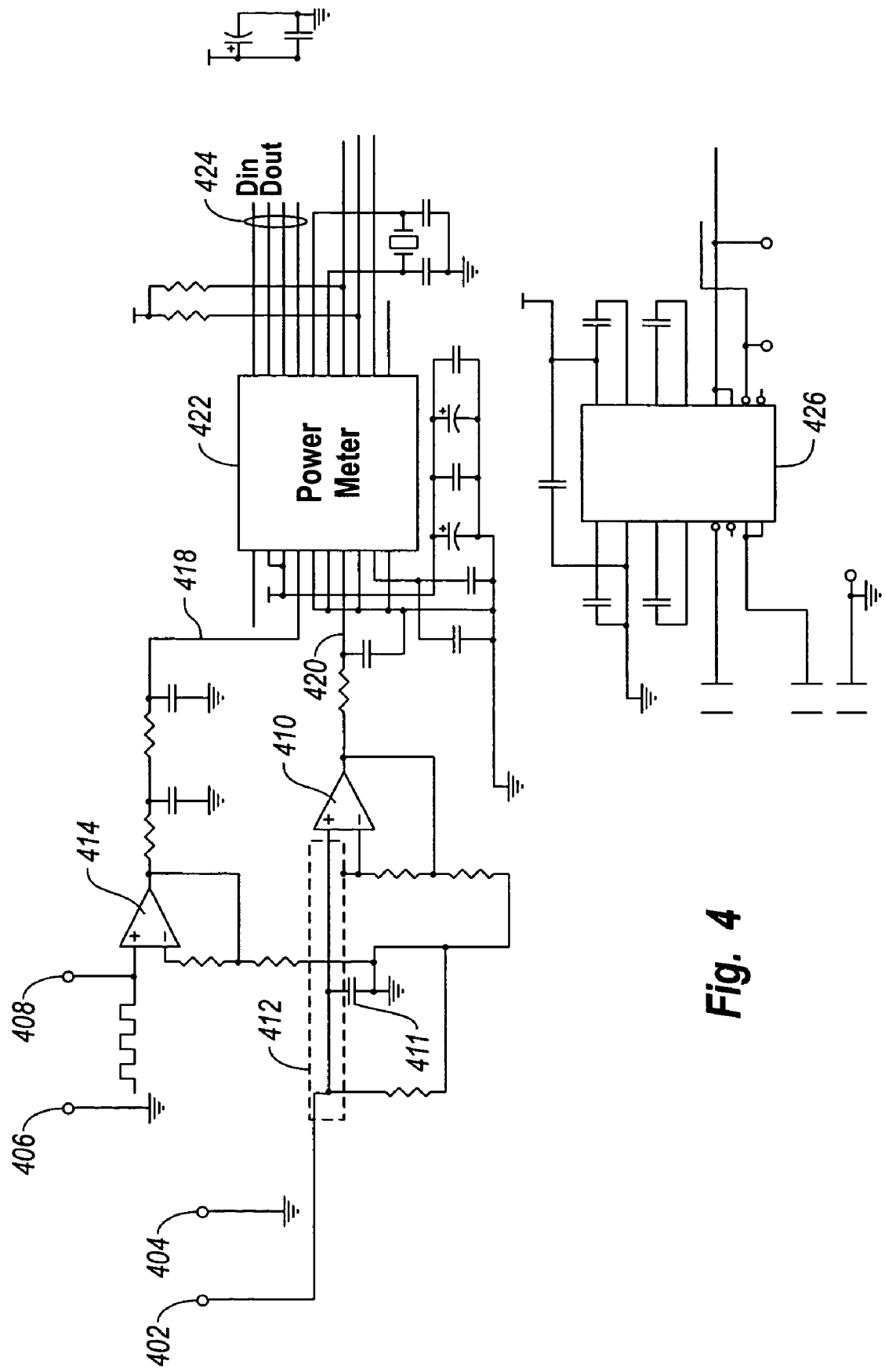
FIG. 4 illustrates one embodiment of circuitry used to process the signals received from the flex circuit illustrated in FIGS. 3A and 3B.

FIG. 4 illustrates one embodiment of the circuitry that may be included in a module such as the module 100 shown in FIGS. 1A and 1B. Additional circuitry necessary for operation of a power monitoring circuit known in the art has been omitted for clarity. Layer 150 couples to inputs 402 and layer 152 couples to input 404. Alternatively, layer 152 is not present and input 404 couples to system ground. The voltage from the voltage sensing layer 150 is amplified in this example by an op amp 410 and the amplified voltage 420 is input to a power meter integrated circuit 422. The power meter integrated circuit 422 can sample the voltage signal and convert the analog value to a digital value that can be serially output by the power meter integrated circuit 422.

The ends of the coil formed by the traces in the flex circuit are coupled with the inputs 406 and 408. For example, via 190 couples to input 406 and via 192 couples to input 408. The coil formed by the traces experiences a flux density of a magnetic field that is induced by the current in the conductor. Changes in the flux density generates a voltage signal between the inputs 406 and 408 that is proportional to the di/dt of the current. The voltage signal is amplified by the op amp 414 and input to the power meter integrated circuit 422. The power meter integrated circuit 422 includes an integrator that is able to recover the current from the voltage signal that is proportional to the di/dt of the current.

Figure 5:
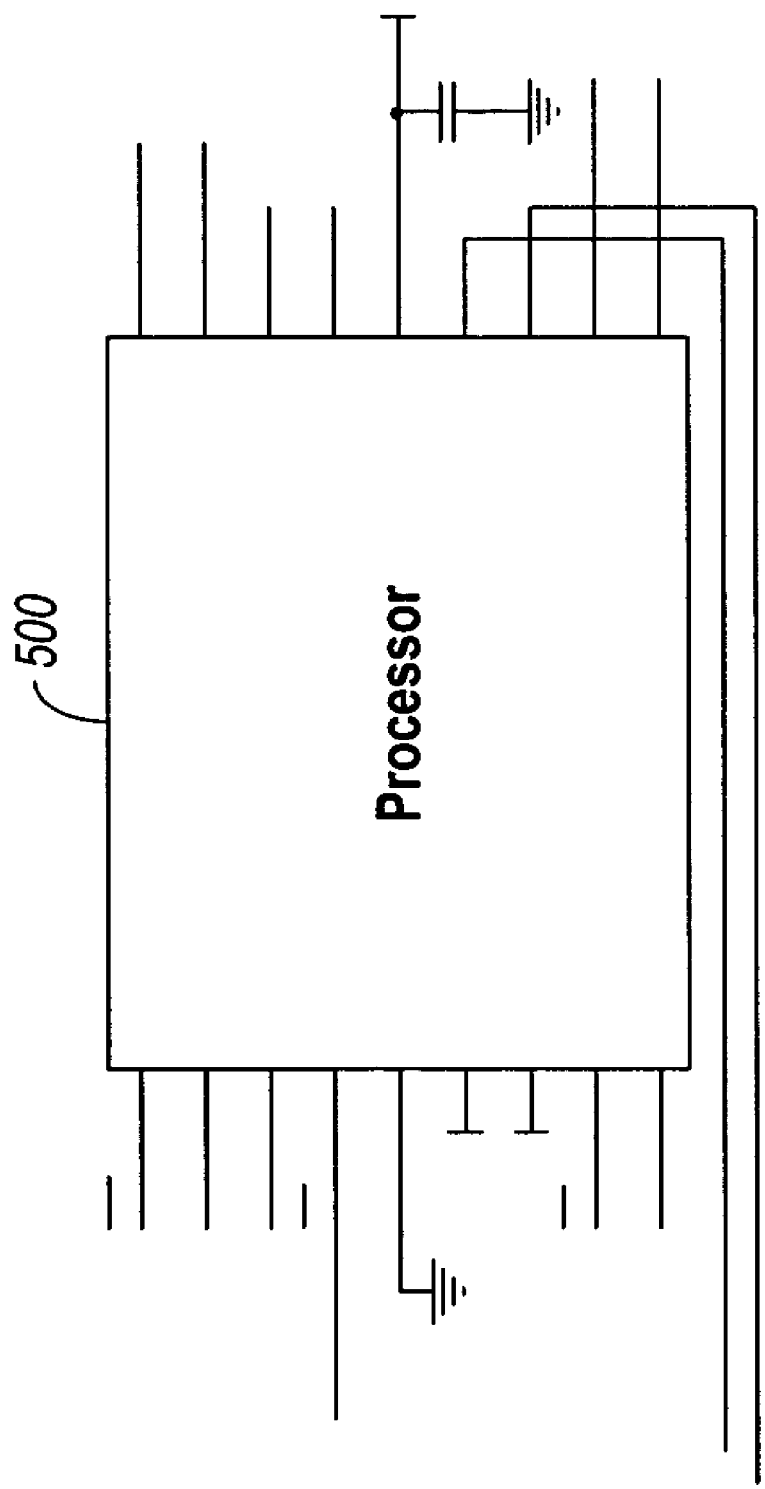
FIG. 5 illustrated additional circuitry that may be included in a module used to process signals from a flex circuit.

The power meter integrated circuit 422 may compute active energy, reactive energy, $V_{rms}$, and $I_{rms}$ or other electric or power parameters. The output of the power meter integrated circuit 422 is typically connected to a processor 500 shown in FIG. 5. Alternatively, the processor 500 may implement the functionality of the power meter integrated circuit 422 or calculate additional power parameters based on the output of the power meter integrated circuit 422 (such as kW, kVAR, kVA, harmonics, frequency, etc.) The processor 500 is coupled to the power meter integrated circuit 422 in this example and provides control signals to the power meter integrated circuit 422 and receives the output from the power meter integrated circuit 422 for further processing. At least the signals 424, which include data in and data out, are coupled to the processor 500. One example of the power meter integrated circuit 422 is a data converter from Analog Devices Inc. located in Cambridge, Mass. and identified by chip number ADE7753. One example of the processor 500 is the model PIC18F1320 from Microchip Technology Inc. located in Chandler, Ariz.

The module 426 is a communications integrated circuit and may be used as a port to send data from the processor 500 to a display on the module 100. Alternatively, the module 426 may send and receive power monitoring data via wireline or wireless communications links to a remote computer. The display, for example, may display the current, voltage, and or energy determined by the module 100 from the signals received from the flex circuit 104. The module may make recordings of power parameters in a memory. Such recordings may include sequence of events, waveform and/or event recordings. The module 426 may interface to an appropriate network for communications with remote power management software.

Figure 6:
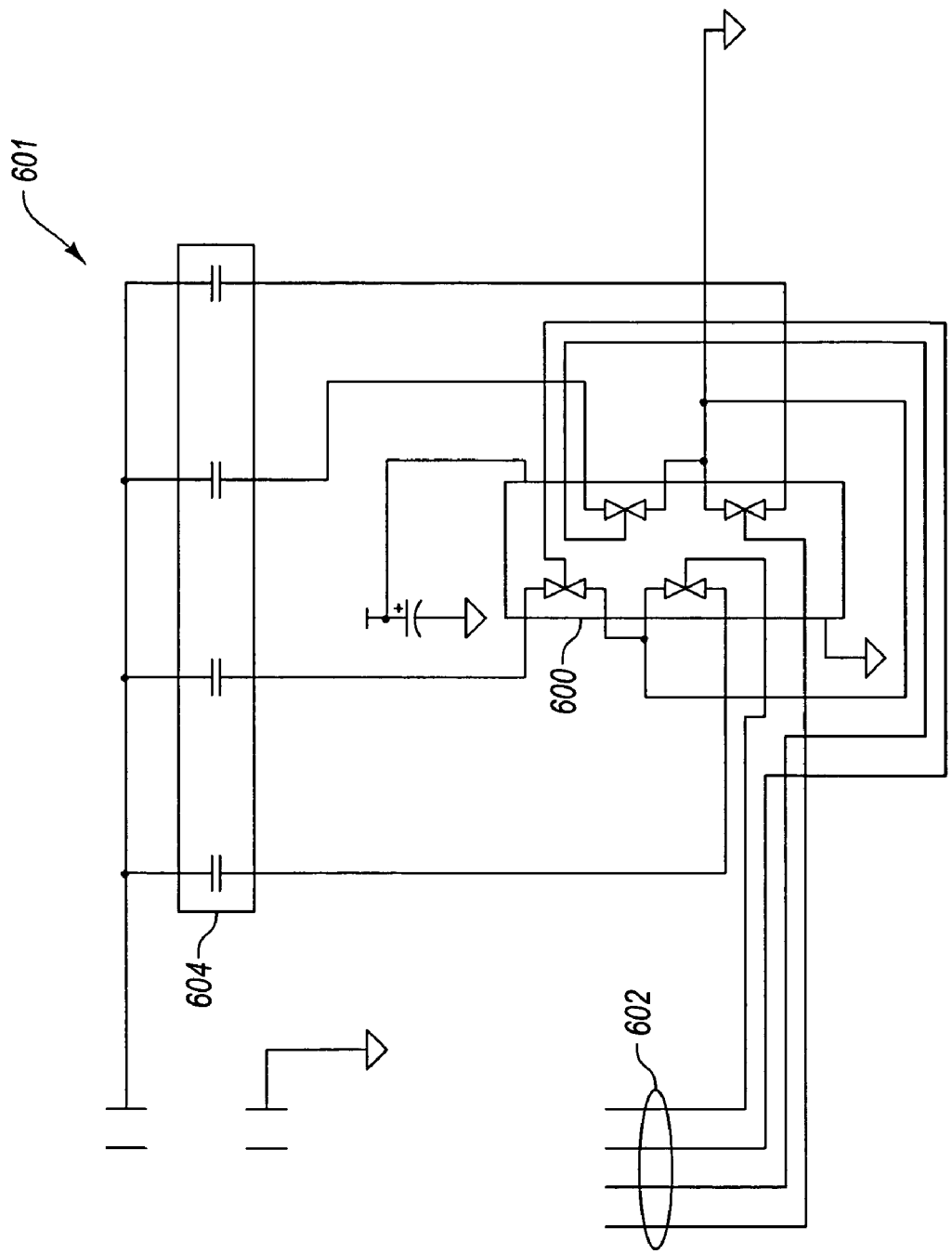
FIG. 6 illustrates a switching circuit that permits the module to accommodate a wide range of voltages and currents by enabling various capacitances to be included in the capacitive voltage divider.

FIG. 6 represents a switched capacitor bank 601 that is one embodiment of the capacitor 411 shown in FIG. 4. A number of analog switches 600 are provided that are controlled by the processor 500 through the control lines 602. Each analog switch 600 is coupled to at least one of the capacitors 604. The analog switches 600 enable the capacitance associated with the flex circuit and the conductor to be determined. More specifically, the switched capacitor bank 601 can be set to a first known capacitance and the $V_{rms}$ across the switched capacitor bank 601 is then measured. Then, the switched capacitor bank 601 is set to a second capacitance and the $V_{rms}$ is measured. The analog switches 600 may be for example back to back MOSFET transistors such as provided by model SN74HC4066D manufactured by Texas Instruments Inc. located in Dallas, Tex.

Due to the fact the capacitance formed between the layer 150 and the conductor 102 is installation dependent (i.e., the thickness and material of the insulation covering conductor 102, tightness of connection, air gap, orientation, etc. of installation may affect the capacitance) it is desirable to "calibrate out" these effects. Once the flex circuit is installed or coupled to the conductor, the capacitance should remain relatively stable (at least over some time period). Therefore, the capacitance can be determined using the following procedure and this value of capacitance may be used in subsequent calculations of the voltage on conductor 102.

The $V_{rms}$ can be measured using the voltage signal from the voltage sensing layer when only the capacitance of the capacitor 411 (or of the capacitor bank 601) is known. With the information provided using different capacitances in the capacitor bank 601, the capacitance associated with the plane layers of the flex circuit can be derived. This enables the voltage of the conductor to be measured as it changes. The switched capacitor bank 601 also enables the module to perform auto ranging and auto detection of the voltage in the conductor. The capacitance of plate or layer 150 to the conductor 102 plus the capacitance of plate or layer 152 to ground (if present) can be calculated from the following formula when the voltage on the conductor 102 is approximately constant:

$$C = \frac{V1 * C1 - V2 * C2}{V2 - V1}$$

where:

V1 is the voltage measured across capacitor bank 601 when capacitor bank 601 has a value of C1 and V2 is the voltage measured across capacitor bank 601 when capacitor bank 601 has a value of C2.

Thereafter, the voltage on conductor 102 can be measured using the following formula:

$$V = Vcb * \left(1 + \frac{Ccb}{C}\right)$$

where:

V is the voltage on conductor 102,
$V_{cb}$ is the voltage measured across capacitor bank 601 and
$C_{cb}$ is the capacitance of the capacitor bank 601.

In order that the signal across capacitor bank 601 does not exceed the input range of the A/D converter within processor 500 or the power meter integrated circuit, the capacitance of capacitor bank 601 is first set to a large value. This ensures a minimum voltage drop across capacitor bank 601. The capacitor bank value may then be increased to an optimal value for measurement of voltage in a particular installation. In this fashion, the circuit is autoranging. The individual capacitors within capacitor bank 601 may be binary weighted such that the first capacitor has a value of 1000 pF, the second 2000 pF, etc., for efficiency, wide range and ease in selecting a value of capacitance for capacitor bank 601.

A three phase monitoring system can be implemented using three sets of flex circuits 104 as described above. These flex circuits 104 may be coupled to one common module 100 or individual modules 100 for each flex circuit 104. In this configuration, the power meter circuit 422 and/or processor 500 may calculate three phase power monitoring parameters such as volts line to line, kW total, etc. In an embodiment where each flex circuit 104 is coupled to the same module 100, the module 100 may provide separate inputs for each flex circuit.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A power monitoring system for monitoring electrical characteristics of a conductor through which electrical power is supplied to a load, the system comprising:
   a flex circuit having a plurality of layers, wherein the flex circuit is operative to be coupled with a conductor such that a plurality of traces in the flex circuit form a coil structure around the conductor, the plurality of layers including:
      a voltage sensing layer including a conducting plane that is nearest the conductor when the flex circuit is couples with the conductor, wherein the voltage sensing layer forms a first capacitance with the conductor; and
   a module that receives signals produced by the flex circuit, wherein the module processes the signals to determine at least one of a voltage, a current, and an amount of energy delivered to a load through the conductor.

2. A power monitoring system as defined in claim 1, wherein the plurality of layers in the flex circuit further comprises:
   a current sensing layer including a coil layer adjacent to the voltage sensing layer, wherein the coil layer includes one or more layers of conductive traces; and a ground layer adjacent to the coil layer.

3. A power monitoring system as defined in claim 2, wherein the coil layer provides a voltage signal to the module, the module integrating the voltage input to determine a current of the conductor.

4. A power monitoring system as defined in claim 2, wherein the voltage sensing layer provides a voltage signal that is used by the module to determine a voltage of the conductor.

5. A power monitoring system as defined in claim 2, wherein the coil layer further comprises a plurality of traces in one or more layers.

6. A power monitoring system as defined in claim 2, wherein the flex circuit further comprises first vias on one end of the flex circuit and second vias on a second end of the flex circuit opposite the first end, wherein the first vias and the second vias electrically connect traces in a first layer of the coil layer with traces in a second layer of the coil layer.

7. A power monitoring system as defined in claim 6, wherein the plurality of traces includes the traces in the first layer and the traces in the second layer such that the plurality of traces forms a single conductive path in the coil layer.

8. A power monitoring system as defined in claim 2, wherein the module further comprises a switched capacitor bank coupled to a first capacitance between the voltage sensing layer and the conductor.

9. A power monitoring system as defined in claim 8, wherein the switched capacitor bank further comprises a plurality of switches controlled by a processor such that a capacitance of the switched capacitor bank can be adjusted, thereby enabling the module to perform autoranging and autodetection of the voltage of the conductor.

10. A power monitoring system as defined in claim 8, wherein the module uses the switched capacitor bank to determine a value of the first capacitance.

11. The power monitoring system as defined in claim 10, wherein the module uses the value and the capacitance of the switched capacitor bank to determine the voltage on the conductor.

12. The power monitoring system as defined in claim 8, wherein the module uses the switched capacitor bank to determine a value of the first capacitance in combination with a capacitance between the ground layer of the flex circuit and a ground of the load.

13. A power monitoring system for monitoring voltage and or current in a conductor that provides electrical power to a load, the power monitoring system comprising:
   a module;
   a flex circuit coupled to the module, the flex circuit having a voltage sensing layer and a coil layer, wherein the flex circuit is configured to wrap around a conductor;
   a first input in the module that receives a first voltage signal from the voltage sensing layer, the module identifying a voltage of the conductor from the first voltage signal; and
   a second input in the module that receives a second voltage signal from the coil layer, wherein the module integrates the second voltage signal to determine a current of the conductor.

14. A power monitoring system as defined in claim 13, wherein the first input further comprises an amplifier that is coupled to a power meter integrated circuit adapted to convert the voltage signal to the voltage of the conductor, wherein the second input further comprises an amplifier that is coupled to the power meter integrated circuit that is adapted to integrate the second voltage signal to produce the current of the conductor.

15. A power monitoring system as defined in claim 14, the module further comprising a processor that is coupled to the power meter integrated circuit via one or more control lines.

16. A power monitoring system as defined in claim 15, the module further comprising a port for exporting at least one of the voltage of the conductor, the current of the conductor, the power flow in the conductor and the energy flow in the conductor to a display.

17. A power monitoring system as defined in claim 13, the module further comprising a communications port for exporting at least one of the voltage of the conductor, the current of the conductor, the power flow in the conductor and the energy flow in the conductor to a remote device.

18. A power monitoring system as defined in claim 13, the flex circuit further comprising a ground layer arranged next to the coil layer such that the coil layer is between the coil layer and the voltage sensing layer.

19. A power monitoring system as defined in claim 13, wherein the coil layer further comprises a single conductive path that forms a coil structure when the flex circuit is wrapped around the conductor such that the coil layer generates the second voltage signal in response to magnetic flux.

20. A power monitoring system as defined in claim 13, wherein the coil layer further comprises a first layer of traces and a second layer of traces.

21. A power monitoring system as defined in claim 20, wherein the flex circuit further comprises a first end having first vias and a second end having second vias, wherein the first vias and the second vias electrically connect the first layer of traces with the second layer of traces to form a single conductive path in the coil layer.

22. A power monitoring system as defined in claim 13, the module further comprising a switched bank of capacitors controlled by a processor, wherein the switched bank of capacitors enables the module to determine a capacitance between the voltage sensing layer and the conductor and a capacitance between the ground layer and a ground of a load.

23. A power monitoring system as defined in claim 13, further comprising a high gain circuit coupled to the second voltage signal, wherein the high gain circuit produces a square wave used for frequency measurement.

24. A power monitoring system for monitoring at least one power parameter in a conductor that provides electrical power to a load, the power monitoring system comprising:
   a metallic layer operative to be wrapped around a conductor while remaining electrically insulated from the conductor;
   a capacitor bank coupled between the metallic layer and a ground point, the capacitor bank operative to apply different capacitances between the metallic layer and the ground point;
   a processor operative to adjust the capacitance of the capacitor bank, the processor operative to measure voltages across the capacitor bank for at least two different capacitances and operative to calculate the voltage on the conductor therefrom.

25. The power monitoring system as defined in claim 24 wherein the ground point is a system ground.

26. The power monitoring system as defined in claim 25 further comprising a communications circuit coupled to the processor and operative to transmit the measured voltage via at least one of a wired and a wireless communications link.

27. The power monitoring system as defined in claim 24 further comprising a second metallic layer forming a capacitance from the ground point to a system ground.

* * * * *